United States Patent [19]

Kawai

[11] Patent Number: 4,568,791
[45] Date of Patent: Feb. 4, 1986

[54] SOLAR CELL COMPRISING AN UNDULATED TRANSPARENT CONDUCTIVE LAYER

[75] Inventor: Hisao Kawai, Tokyo, Japan

[73] Assignee: 501 Hoya Corporation, Tokyo, Japan

[21] Appl. No.: 558,111

[22] Filed: Dec. 5, 1983

[30] Foreign Application Priority Data

Dec. 4, 1982 [JP] Japan .................. 57-213202

[51] Int. Cl.⁴ .......................................... H01L 31/06
[52] U.S. Cl. ..................... 136/256; 136/258; 357/30; 357/65; 357/67; 204/192 N; 427/166; 427/255
[58] Field of Search ............. 136/256, 258 AM; 357/30, 65, 67, 68; 204/192 N; 427/166, 255

[56] References Cited

U.S. PATENT DOCUMENTS 4,500,743  2/1985  Hayashi et al. .............. 136/258

FOREIGN PATENT DOCUMENTS 2514201  4/1983  France ...................... 136/258 AM
57-49278  3/1982  Japan ....................... 136/258 AM

OTHER PUBLICATIONS

H. Takakura et al, "Paint-on-Diffusant $SnO_2/n^+-p$ Si Heteroface Solar Cell", *Jap. J. Appl. Phys.*, vol. 19, (1980) Supplement 19-2, pp. 61-65.

Primary Examiner—Aaron Weisstuch
Attorney, Agent, or Firm—Roberts, Spiecens & Cohen

[57] ABSTRACT

In a solar cell comprising first and second members opposite other and an amorphous silicon lamina interposed between the first and the second members, a predetermined one of the first and the second members comprises a transparent conductive layer having an average particle size between 300 and 900 angstroms. The transparent conductive layer is positioned between the amorphous silicon lamina and a transparent insulative substrate (11) directed towards light when the first member is transparent while the transparent conductive layer is overlaid on the amorphous silicon layer and directed towards the light when the second member is transparent. The transparent conductive layer may comprise indium oxide, tin oxide, indium tin oxide, or the like.

2 Claims, 5 Drawing Figures

SOLAR CELL COMPRISING AN UNDULATED TRANSPARENT CONDUCTIVE LAYER

BACKGROUND OF THE INVENTION

This invention relates to a solar cell for use in converting optical energy into electrical energy.

A conventional solar cell comprises first and second members opposite each other and an amorphous silicon lamina between the first and the second members. The first and second members serve as electrodes. In such a solar cell, a predetermined one of the first and the second members should be transparent in order to expose the amorphous silicon lamina to light and to generate electromotive force across the first and the second members.

It is preferable that the solar cell have a high conversion efficiency of optical energy to electrical energy. Various attempts have been directed to improvement of characteristics of the amorphous silicon lamina so as to increase the conversion efficiency. In other words, such attempts have practically left the first and the second members out of consideration. The conversion efficiency increases to some extent by improving the characteristics of the amorphous silicon lamina. However, an increase of the conversion efficiency as a result of such efforts, reaches a limit. In addition, the conversion efficiency of each solar cell is extremely variable even when the amorphous silicon lamina is deposited under the same conditions.

SUMMARY OF THE INVENTION

It is an object of this invention to provide a solar cell which has an improved conversion efficiency.

It is another object of this invention to provide a solar cell of the type described, which is capable of reducing the variation of the conversion efficiency.

A solar cell to which this invention is applicable comprises a first and a second member and an amorphous silicon lamina between the first and second members. A predetermined one of the first and the second members comprises a transparent conductive layer of a preselected material. According to this invention, the transparent conductive layer comprises an aggregation of particles of the preselected material which have an average particle size between 300 angstroms and 900 angstroms.

DESCRIPTION OF THE PREFERRED EMBODIMENTS

Figure 1:
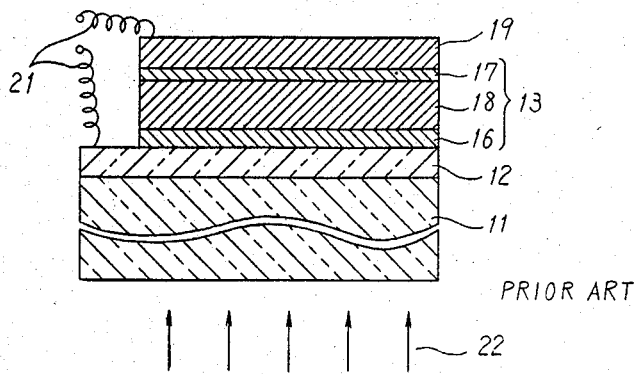
FIG. 1 shows a sectional view of a conventional solar cell.

Referring to FIG. 1, a conventional solar cell will at first be described for a better understanding of this invention. The illustrated solar cell has a transparent substrate 11 comprising an insulator material having first and second principal surfaces directed upwards and downwards in the figure, respectively. The transparent substrate 11 may be of soda-lime glass. A transparent conductive layer 12 is coated on the first principal surface of the substrate 11 and serves as an electrode of the solar cell. The combination of the substrate 11 and the transparent conductive layer 12 may be called a first member. The transparent conductive layer 12 may be selectively removed to form a pattern, if necessary.

An amorphous silicon lamina 13 is attached to the transparent conductive layer 12 and comprises a P-type amorphous silicon layer 16 in contact with the transparent conductive layer 12, an N-type amorphous silicon layer 17 opposite the P-type silicon layer 16, and an intrinsic silicon layer 18 interposed between the doped amorphous silicon layers 16 and 17.

An aluminum layer 19 is deposited on the N-type silicon layer 17 and may be called a second member serving as the other electrode of the solar cell. A pair of conductors 21 extend from the first and the second members to be connected to a load (not shown).

In the illustrated example, the second principal surface of the substrate 11 is directed towards light indicated by arrows 22. As a result, the light 22 is incident on the amorphous silicon lamina 13 through the transparent substrate 11 and the transparent conductive layer 12. The amorphous silicon lamina 13 is activated by the incidence of light to develop electromotive force across the transparent conductive layer 12 and the aluminum layer 19. The electromotive force is delivered to the conductors 21 as electric power.

In order to improve the conversion efficiency of the solar cell, various kinds of improvements to the amorphous silicon lamina 13 have been contemplated as described in the Background section of the instant specification.

According to the inventor's experimental studies, it has been found out that the conversion efficiency is dependent not only on the amorphous silicon lamina 13 but also on the transparent conductive layer 12, as will become clear.

Figure 2:
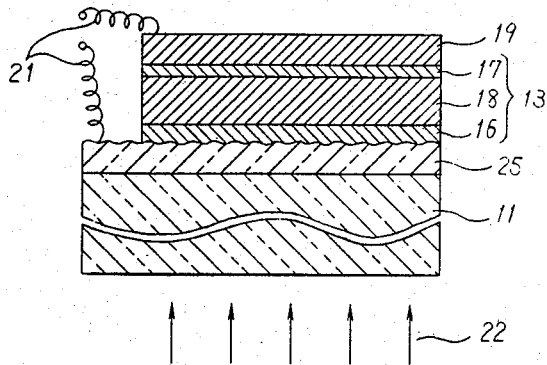
FIG. 2 diagrammatically shows a sectional view of a solar cell according to a first embodiment of this invention.

Referring to FIG. 2, a solar cell according to a first embodiment of this invention comprises similar parts designated by like reference numerals. The illustrated solar cell comprises a specific transparent conductive layer 25 which comprises tin doped indium oxide, i.e. indium tin oxide. The illustrated indium tin oxide layer includes, by weight, 5% of tin oxide. The specific transparent conductive layer 25 is deposited to a thickness of 700 angstroms by vacuum evaporation and is formed by an aggregation of particles which have an average particle size not smaller than 300 angstroms. The vacuum evaporation is carried out at a pressure of oxygen and temperature of the substrate 11 of $10^{-4}$ Torr and 350° C., respectively. The deposition rate is about 1.5 angstroms/second. The particles are crystals of indium tin oxide. In order to determine the average particle size, the particles, namely the crystals, are at first observed through a scanning electron microscope. The particle size of each particle is defined by the maximum size of each particle. For example, the diameter, the transverse axis, and the diagonal determine the particle sizes when the particles are circular, elliptical, and rectangular, respectively. In order to obtain the average particle size, a calculation is made of the total number and the total size of the particles which have sizes not less than 200 angstroms. Thereafter, the total size is divided by the total number. Particles with sizes less than 200 angstroms are not included in the calculation.

As a result of the above-mentioned calculation, the illustrated conductive layer 25 has an average particle size of 300 angstroms. The sheet resistance of the transparent conductive layer 25 is about 30 ohms/□.

The transparent conductive layer 25 is undulated or uneven on the surface thereof, as diagrammatically illustrated in FIG. 2 in exaggerated form and serves as the first member.

As in FIG. 1, an amorphous silicon lamina 13 is deposited on the transparent conductive layer 25 by the use of a glow-discharge decomposition method known in the art. An aluminum layer 19 which serves as the second member is formed on the amorphous silicon lamina 13 by vacuum evaportion. The conductors 21 are connected to the first and the second members, respectively.

Figure 3:
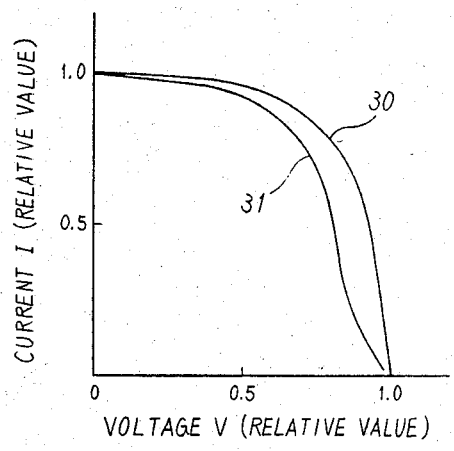
FIG 3 shows voltage versus current characteristics of the conventional solar cell and the solar cell illustrated in FIG. 2.

Referring to FIG. 3, curve 30 shows the voltage versus current characteristic of the solar cell illustrated in FIG. 2. On the other hand, curve 31 shows a similar characteristic of a reference solar cell as illustrated in FIG. 1. The reference solar cell comprises an indium tin oxide layer 12 having an average particle size smaller than 200 angstroms. Specifically, the indium tin oxide layer in the conventional solar cell comprises particles most of which are smaller than 200 angstroms and which never exceed 300 angstroms.

Each characteristic is measured by exposing each of the solar cells to light of to AM1 (Air Mass 1).

It is possible to estimate the characteristic of each solar cell by the absolute value of the reciprocal of the gradient at I=O from the expression: $|\partial V/\partial I|_{I=O}$, as known in the art. More particularly, the smaller the absolute value, the better the characteristics of the solar cell. Under the circumstances, it is readily understood that the solar cell according to the first embodiment of this invention is remarkably smaller in absolute value than the reference solar cell and, therefore, has an excellent characteristic in comparison with the conventional one. This means that the conversion efficiency of the solar cell illustrated in FIG. 2 is improved because a reduction of the absolute value contributes to a decrease of the internal resistance and, therefore, to an improvement in the fill factor.

Practically, the fill factor and the conversion efficiency of the solar cell according to this invention are improved by about 20% and 20% respectively as compared with those of the conventional solar cell. This is because the contact area increases between the amorphous silicon lamina 13 and the undulated transparent conductive layer 25 and, as a result, the electrical contact between them is improved. In other words, the undulated conductive layer 25 serves to protect the light from being scattered from the amorphous silicon lamina 13. The light is therefore effectively utilized to excite the amorphous silicon lamina 13.

In order to confirm or establish the relationship between the average particle size of the indium tin oxide and the voltage versus current characteristic, various samples were manufactured in the above-mentioned manner. When the samples had an average particle size of the indium tin oxide layer which was less than 300 angstroms, their voltage versus current characteristics were substantially identical to the curve 31. When the average particle size exceeded 300 angstroms, the characteristics approached that of curve 30. From this fact, it has been contemplated that the average particle size of the indium tin oxide layer should not be smaller than 300 angstroms so as to improve the conversion factor in the solar cell. According to the inventor's experimental studies, the desired average particle size is made possible by controlling the pressure of oxygen and the deposition rate with the substrate 11 kept at 350° C. For example, an average particle size of 350 angstroms can be obtained at a pressure of $2 \times 10^{-4}$ Torr and a deposition rate of 1 angstrom/second while an average particle size of 800 angstroms can be obtained at a pressure of $10^{-4}$ Torr and a deposition rate of 0.5 angstrom/second.

Examination has been made regarding the relationship between the conversion efficiency and the number of the particles included in each solar cell according to the first embodiment of this invention. As a result, it has been found that at least ten of the particles may be present per square micron and preferably, at least one hundred of the particles are present per square micron. As mentioned before, each particle is not smaller than 200 angstroms.

Figure 4:
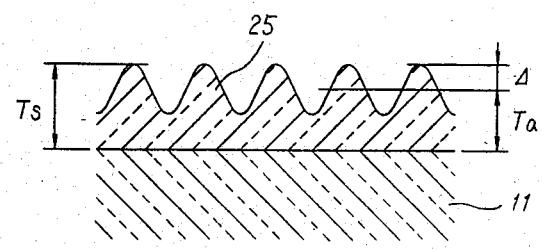
FIG. 4 shows a partial sectional view of the solar cell illustrated in FIG. 2.

Referring to FIG. 4, a factor $\Delta$ has been introduced so as to determine an upper limit of the average particle size. As shown in FIG. 4, the specific transparent conductive layer 25 undulates on a surface thereof and therefore has projections and notches on the surface. A thickness Ts is measured at each projection by the use of a standard thickness gauge of the probe type. On the other hand, the average thickness Ta can be optically measured in a known manner. The above-mentioned factor $\Delta$ is defined as the difference between the thickness Ts of each projection and the average thickness Ta and may be called a difference factor. When the difference factor is between 100 and 650 angstroms, a conversion efficiency of about 6% is obtained and practically utilized as a solar cell. In addition, it has been found that difference factors $\Delta$ of 100 and 650 angstroms correspond to the average particle sizes of about 300 and 900 angstroms, respectively. In this connection, the average particle size is preferably not larger than 900 angstroms. As is evident, the thickness $T_S$ and the factor $\Delta$ increases for increased average particle size.

Figure 5:
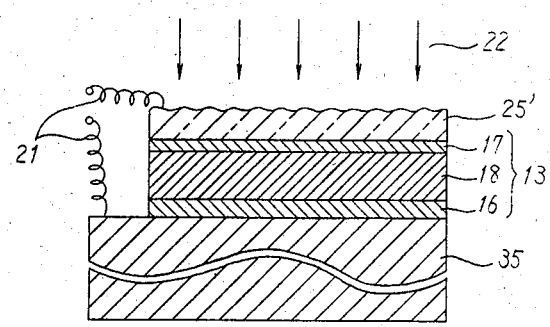
FIG. 5 shows a sectional view of a solar cell according to a second embodiment of this invention.

Referring to FIG. 5, a solar cell according to a second embodiment of this invention comprises, as the first electrode member, a conductive substrate 35 of a metal, such as stainless steel or the like. A transparent conductive layer 25' which is similar to that illustrated in FIG. 2 is formed on the amorphous silicon lamina 13. The amorphous silicon lamina 13 is identical with that shown in FIG. 2. The transparent conductive layer 25' may be of indium tin oxide as in FIG. 2 and comprises an aggregation of particles which are not smaller in particle size than 300 angstroms. In this solar cell, the transparent conductive layer 25' serves as the second member and is directed towards light 22, as shown in FIG. 5.

With this structure also, the conversion efficiency has been improved when the average particle size is between 300 and 900 angstroms, as is the case with FIG. 2.

Although vacuum evaporation is used to deposit the specific transparent conductive layer 25 or 25' in the first and the second embodiments, a radio frequency (RF) reactive ion plating method may be carried out instead of vacuum evaporation. In this event, it has been found out that the average particle size tends to increase with a reduction in RF power. For example, the average particle sizes became substantially equal to 300, 500, and 800 angstroms when the RF power was adjusted to 300, 200, and 100 watts, respectively, and the substrate 11 or 35, the pressure of oxygen, and the deposition rate were kept at 300° C., $1\times10^{-4}$ Torr, and 3 angstroms/second, respectively.

It is also possible to control the average particle size of the indium tin oxide by varying the pressure of oxygen and/or the deposition rate.

While this invention has thus far been decribed in conjunction with a few embodiments thereof, it will readily be possible for those skilled in the art to practice this invention various techniques. For example, various evaporation methods such as d.c. ion plating, activated reactive methods, or the like may be employed to deposit the transparent conductive layer. The transparent conductive layer may singly comprise either indium oxide or tin oxide. Other materials may also be included in the transparent conductive layer. A plurality of transparent conductive layers may also be included in the solar cell.

What is claimed is:

1. A solar cell comprising a first member, a second member opposite said first member, and an amorphous silicon lamina connected between said first and said second members, a predetermined one of said first and said second members comprising a transparent conductive layer of indium tin oxide which comprises an aggregation of particles having an average particle size between 300 and 900 angstroms, said transparent conductive layer being obtained by evaporation by controlling at least one of the pressure of oxygen and the deposition rate during said evaporation, said transparent conductive layer having a thickness of about 700 angstroms for an average particle size not smaller than 300 angstroms and said thickness increasing for increased average particle size.

2. A solar cell comprising a first member, a second member opposite said first member, and an amorphous silicon lamina connected between said first and said second members, a predetermined one of said first and said second members comprising a transparent conductive layer of indium tin oxide which comprises an aggregation of particles having an average particle size between 300 and 900 angstroms, said transparent conductive layer having a thickness of about 700 angstroms for an average particle size not smaller than 300 angstroms and said thickness increasing for increased average particle size, said transparent conductive layer being obtained by radio frequency ion plating by controlling at least one of the pressure of oxygen, the deposition rate, and radio frequency power.

* * * * *